(12) United States Patent
Chun et al.

(10) Patent No.: US 12,522,559 B2
(45) Date of Patent: Jan. 13, 2026

(54) LEVELING AGENT AND ELECTROLYTIC COMPOSITION FOR FILLING VIA HOLE

(71) Applicant: YMT CO., LTD., Incheon (KR)

(72) Inventors: Sung Wook Chun, Incheon (KR); Bo Mook Chung, Incheon (KR); Dea Geun Kim, Incheon (KR); Nak Eun Ko, Bucheon-si (KR); Ju Yong Sim, Seoul (KR)

(73) Assignee: YMT CO., LTD., Incheon (KR)

( * ) Notice: Subject to any disclaimer, the term of this patent is extended or adjusted under 35 U.S.C. 154(b) by 629 days.

(21) Appl. No.: 17/926,115

(22) PCT Filed: Jul. 29, 2022

(86) PCT No.: PCT/KR2022/011227
§ 371 (c)(1),
(2) Date: Nov. 17, 2022

(87) PCT Pub. No.: WO2023/008963
PCT Pub. Date: Feb. 2, 2023

(65) Prior Publication Data
US 2024/0132441 A1    Apr. 25, 2024

(30) Foreign Application Priority Data
Jul. 30, 2021   (KR) ........................ 10-2021-0100645

(51) Int. Cl.
| C07C 217/76 | (2006.01) |
| C07D 213/30 | (2006.01) |
| C23C 18/16 | (2006.01) |
| C23C 18/38 | (2006.01) |
| C23C 28/02 | (2006.01) |
| C25D 3/38 | (2006.01) |
| C25D 5/18 | (2006.01) |
| H05K 3/42 | (2006.01) |

(52) U.S. Cl.
CPC .......... *C07C 217/76* (2013.01); *C07D 213/30* (2013.01); *C23C 18/1653* (2013.01); *C23C 18/38* (2013.01); *C23C 28/023* (2013.01); *C25D 3/38* (2013.01); *C25D 5/18* (2013.01); *H05K 3/425* (2013.01); *H05K 2203/072* (2013.01); *H05K 2203/0723* (2013.01)

(58) Field of Classification Search
None
See application file for complete search history.

(56) References Cited

U.S. PATENT DOCUMENTS 5,252,196 A    10/1993 Sonnenberg et al.
2016/0076160 A1    3/2016 Whitten et al.
(Continued)

FOREIGN PATENT DOCUMENTS

EP    1741804 A1    1/2007
JP    2015503033 A    1/2015
(Continued)

*Primary Examiner* — Louis J Rufo
(74) *Attorney, Agent, or Firm* — STIP Law Group, LLC

(57) ABSTRACT

The present invention relates to a leveling agent and an electrolytic composition comprising the same. When the via hole in the substrate is filled with the electrolytic composition according to the present invention, the via hole can be filled within a relatively short time while minimizing the formation of dimples or voids.

8 Claims, 3 Drawing Sheets

(56) References Cited

U.S. PATENT DOCUMENTS

2018/0237932 A1    8/2018   Rohde et al.
2019/0309429 A1*   10/2019   Kienle ................... C25D 7/123

FOREIGN PATENT DOCUMENTS

| JP | 2019085647 | A |   | 6/2019  |              |
|----|------------|---|---|---------|--------------|
| JP | 2020502370 | A |   | 1/2020  |              |
| KR | 20110103891| A |   | 9/2011  |              |
| KR | 20120067315| A |   | 6/2012  |              |
| KR | 20120077058| A |   | 7/2012  |              |
| KR | 20190061627| A |   | 6/2019  |              |
| KR | 102339861  | B1| * | 12/2021 | ...... C25D 3/02 |
| KR | 102339862  | B1|   | 12/2021 |              |
| KR | 102339868  | B1|   | 12/2021 |              |

* cited by examiner

【Figure 1】
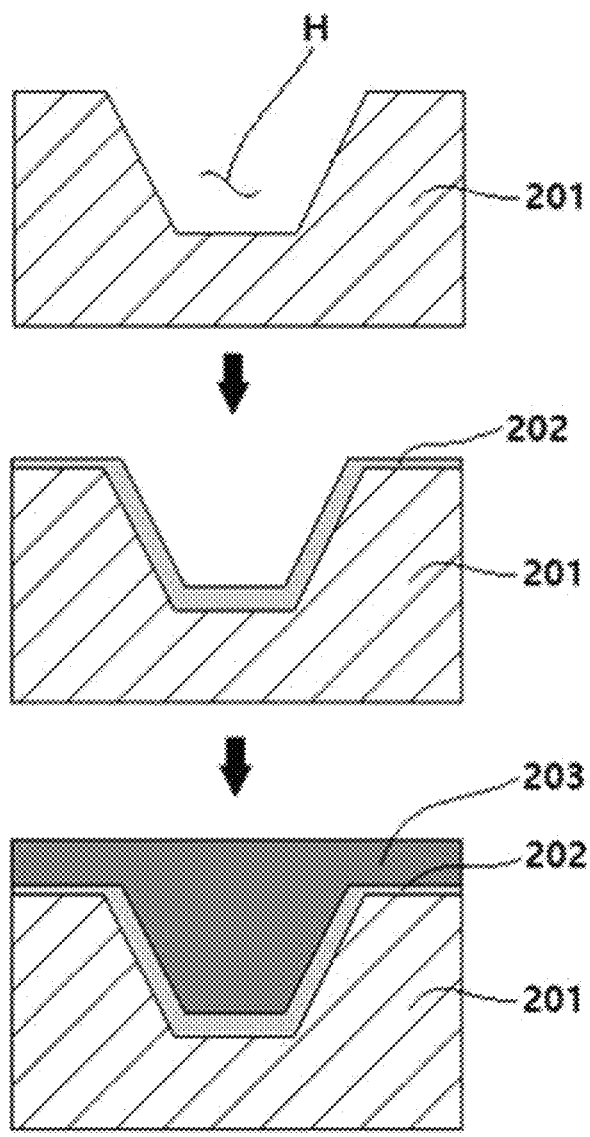

[Figure 2]
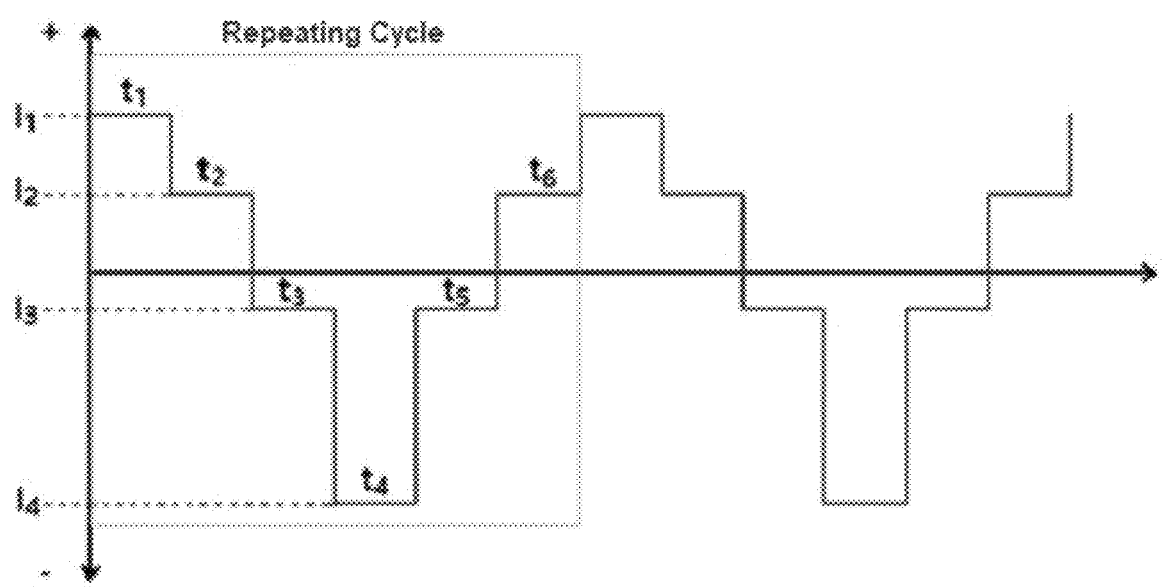

[Figure 3]
Preparation Example
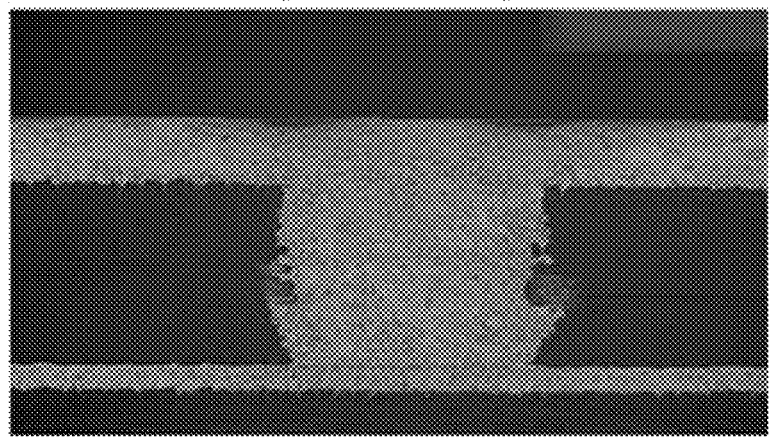
Comparative Preparation Example
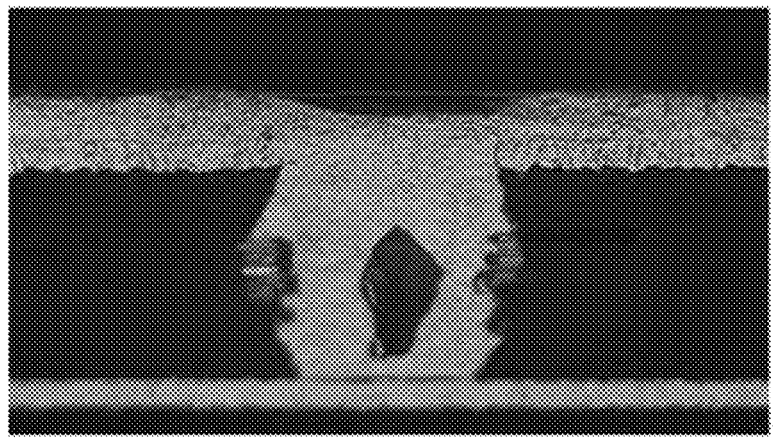

LEVELING AGENT AND ELECTROLYTIC COMPOSITION FOR FILLING VIA HOLE

CROSS-REFERENCE TO RELATED APPLICATIONS

This application is the U.S. National Phase under 35 U.S.C. § 371 of International Application No. PCT/KR2022/011227 filed on Jul. 29, 2022, which in turn claims the benefit of Korean Application No. 10-2021-0100645 filed on Jul. 30, 2021, the disclosures of which are incorporated by reference into the present application.

BACKGROUND

(a) Technical Field

The present invention relates to a leveling agent capable of efficiently copper electroplating filling the inside of a via hole formed in the manufacturing process of a printed circuit board, and an electrolytic composition comprising the same.

(b) Background Art

In general, a printed circuit board is manufactured by forming metal wiring on one or both surfaces of a substrate made of various synthetic resins and then arranging and fixing semiconductor chips, integrated circuits (ICs) or electronic components, and implementing electric wiring between them. These printed circuit boards are being multi-layered, miniaturized, or made into highly integrated circuits in accordance with the trend requiring high density, high performance, and thin film of electronic equipment.

The multilayering of the printed circuit board is implemented through a build-up method, a stack via method or the like. In order to implement these methods, the filling of via holes formed during the manufacturing process of the printed circuit board is required. A method of filling the via hole may comprise a filling method using insulating inks or electrically conductive paste, or a filling method using a plating method.

If the via hole is filled by the plating method, the occurrence of voids or dimples due to internal non-filling can be reduced, as compared to the case filled with insulating inks or electrically conductive paste, but there is a problem that the plating process takes a long time and productivity is lowered. Here, in order to increase the productivity of the plating method, a method of reducing the time consumed in the plating process by applying a high current has been proposed, but as a high current is applied, excess hydrogen gas is generated during the plating process, the decomposition rate of the additive is accelerated and the concentration is non-uniform, and the plating is non-uniform, and thus there is a problem that the reliability and stability of the printed circuit board are deteriorated.

Therefore, it is required to develop a technology that can secure the reliability and stability of the printed circuit board while increasing the productivity of the plating method.

PRIOR ART DOCUMENT

Patent Document (Patent Document 1) Korean Laid-open Patent Publication No. 2012-0077058

SUMMARY OF THE DISCLOSURE

The present invention is intended to provide a leveling agent that can efficiently and uniformly fill the inside of the via hole formed in the substrate.

In addition, the present invention is intended to provide a copper electrolytic composition comprising the leveling agent described above.

In addition, the present invention is to provide a method for filling via holes in a substrate with the electrolytic composition.

In order to solve the above problems, the present invention provides a leveling agent that is a compound represented by Formula 1 or Formula 2 below:

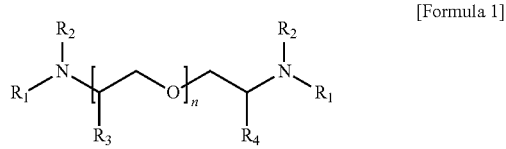

[Formula 1]

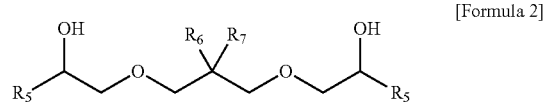

[Formula 2]

wherein, $R_1$ to $R_4$ are each independently selected from the group consisting of a $C_1$ to $C_{10}$ alkyl group, a $C_6$ to $C_{20}$ aryl group, and a $C_2$ to $C_{20}$ heteroaryl group, and in this case, a plurality of $R_1$ are the same as or different from each other, a plurality of $R_2$ are the same as or different from each other, $R_5$ is selected from the group consisting of a $C_1$ to $C_{10}$ alkyl group, a $C_6$ to $C_{20}$ aryl group, a $C_2$ to $C_{20}$ heteroaryl group, and $-NR_{10}R_{11}$, and in this case, a plurality of $R_5$ are the same as or different from each other, $R_6$ and $R_7$ are each independently selected from the group consisting of a $C_1$ to $C_{10}$ alkyl group, a $C_6$ to $C_{20}$ aryl group and a $C_2$ to $C_{20}$ heteroaryl group, n is an integer from 1 to 10, $R_{10}$ and $R_{11}$ are each independently selected from the group consisting of hydrogen, a $C_1$ to $C_{10}$ alkyl group, and a $C_6$ to $C_{20}$ aryl group, and each of the alkyl group, the aryl group and the heteroaryl group of $R_1$ to $R_7$ is each independently substituted or unsubstituted with one or more substituents selected from the group consisting of a halogen group, a $C_1$ to $C_{10}$ alkyl group, and a $C_6$ to $C_{20}$ aryl group.

Meanwhile, the present invention provides an electrolytic composition comprising a metal ion source; and the leveling agent.

In addition, the present invention provides a method of filling the via hole of the substrate comprising the steps of forming a via hole in the substrate; forming an electroless plating layer by performing electroless plating on the substrate on which the via hole is formed; and filling the via hole by performing electrolytic plating on the substrate on which the electroless plating layer is formed, wherein the electrolytic plating is performed by the electrolytic composition.

The leveling agent according to the present invention can keep the decomposition rate, concentration and the like of the additive (e.g., brightener, carrier, accelerator) included in the electrolytic composition constant during the plating process. Therefore, if the filling of the via hole is carried out with the electrolytic composition including the leveling agent according to the present invention, excessive generation of hydrogen gas and uneven plating can be solved even when a high current is applied, thereby improving the productivity, reliability, stability and the like of the printed circuit board.

BRIEF DESCRIPTION OF THE DRAWINGS

FIG. 1 schematically shows a process of filling via holes in the substrate according to an embodiment of the present invention.

FIG. 2 is a diagram illustrating a waveform of a current density applied during electrolytic plating in a process of filling via holes in the substrate according to an embodiment of the present invention.

FIG. 3 shows the experimental results according to Experimental Example 1 of the present invention.

DETAILED DESCRIPTION

The terms and words used in the description and claims of the present invention should not be construed as limited to ordinary or dictionary terms, and should be construed in a sense and concept consistent with the technical idea of the present invention, based on the principle that the inventor can properly define the concept of a term to describe his/her invention in the best way possible.

The present invention relates to a leveling agent capable of efficiently copper electroplating filling the inside of a via hole formed in a substrate, and an electrolytic composition comprising the same, which will be described in detail as follows.

The leveling agent according to the present invention may be a compound represented by Formula 1 or Formula 2 below.

[Formula 1]

[Formula 2]

wherein,
R$_1$ to R$_4$ are each independently selected from the group consisting of a C$_1$ to C$_{10}$ alkyl group (specifically, a C$_1$ to C$_5$ alkyl group), a C$_6$ to C$_{20}$ aryl group (specifically, a C$_6$ to C$_{10}$ aryl group), and a C$_2$ to C$_{20}$ heteroaryl group (specifically, a C$_3$ to C$_{10}$ heteroaryl group), and in this case, a plurality of R$_1$ are the same as or different from each other, a plurality of R$_2$ are the same as or different from each other, R$_5$ is selected from the group consisting of a C$_1$ to C$_{10}$ alkyl group (specifically, a C$_1$ to C$_5$ alkyl group), a C$_6$ to C$_{20}$ aryl group (specifically, a C$_6$ to C$_{10}$ aryl group), a C$_2$ to C$_{20}$ heteroaryl group (specifically, a C$_3$ to C$_{10}$ heteroaryl group), and —NR$_{10}$R$_{11}$, and in this case, a plurality of R$_5$ are the same as or different from each other, and R$_{10}$ and R$_{11}$ are each independently selected from the group consisting of hydrogen, a C$_1$ to C$_{10}$ alkyl group, and a C$_6$ to C$_{20}$ aryl group, R$_6$ and R$_7$ are each independently selected from the group consisting of a C$_1$ to C$_{10}$ alkyl group (specifically, a C$_1$ to C$_5$ alkyl group), a C$_6$ to C$_{20}$ aryl group (specifically, a C$_6$ to C$_{10}$ aryl group) and a C$_2$ to C$_{20}$ heteroaryl group (specifically, a C$_3$ to C$_{10}$ heteroaryl group), and n is an integer from 1 to 10 (specifically, an integer from 1 to 5).

The alkyl group, the aryl group and the heteroaryl group of R$^1$, the alkyl group, the aryl group and the heteroaryl group of R$_2$, the alkyl group, the aryl group and the heteroaryl group of R$_3$, the alkyl group, the aryl group and the heteroaryl group of R$_4$, the alkyl group, the aryl group and the heteroaryl group of R$_5$, the alkyl group, the aryl group and the heteroaryl group of R$_6$, and the alkyl group, the aryl group and the heteroaryl group of R$_7$ may each independently be substituted or unsubstituted with one or more substituents selected from the group consisting of a halogen group, a C$_1$ to C$_{10}$ alkyl group, and a C$_6$ to C$_{20}$ aryl group.

Specifically, considering the interaction between the leveling agent and the additive (e.g., brightener, carrier, accelerator, etc.) added to the electrolytic composition, R$_1$ and R$_2$ may each independently be a C$_1$ to C$_5$ alkyl group substituted with a C$_6$ to C$_{10}$ aryl group. More specifically, both R$_1$ and R$_2$ may be a functional group represented by

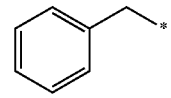

(* means a bonding position).

In addition, R$_3$ and R$_4$ may each independently be a C$_1$ to C$_5$ alkyl group, specifically, a methyl group, an ethyl group, or a propyl group.

In addition, R$_5$ may be selected from the group consisting of a C$_2$ to C$_{10}$ heteroaryl group and —NR$_{10}$R$_{11}$, and in this case, R$_{10}$ and R$_{11}$ may be each independently selected from the group consisting of hydrogen and a C$_6$ to C$_{10}$ aryl group. Specifically, R$_5$ may be a functional group represented by or

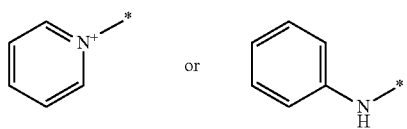 [SMILES: *[n+]1ccccc1 ; *Nc1ccccc1]

(* means a bonding position).

In addition, R$_6$ and R$_7$ may each independently be a C$_1$ to C$_5$ alkyl group, specifically, a methyl group or an ethyl group.

The leveling agent according to the present invention may be embodied as a compound represented by C-1 or C-2 below, but is not limited thereto:

C-1

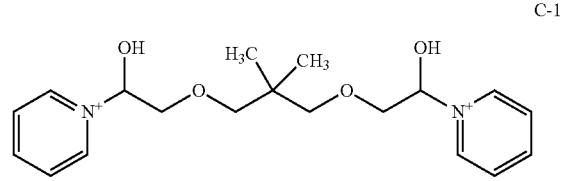

-continued

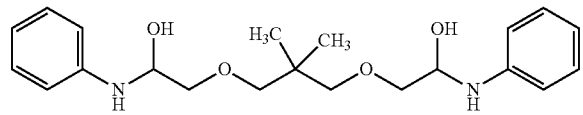

C-2

The heteroaryl group in the present invention may mean a monovalent aromatic ring group including one or more hetero atoms such as N, O, S, F, and the like.

The halogen group in the present invention may mean a fluoro group, a bromo group, a chloro group, an iodo group, and the like.

Meanwhile, the method for synthesizing the leveling agent according to the present invention is not particularly limited, but a method of reacting an alkylation agent compound with an amine-based compound in the presence of a solvent in order to increase synthesis efficiency may be applied. Specifically, the leveling agent according to the present invention can be synthesized by dissolving an alkylation agent compound in a solvent and then adding and reacting an amine-based compound. Here, the alkylation agent compound may be defined as a compound that imparts an alkyl group or an alkylene group in a molecule while performing a substitution reaction with the amine-based compound.

The alkylation agent compound is not particularly limited, but may be at least one selected from the group consisting of 1,4-butane-diol, neopentyl glycol diglycidyl ether, 1,6-hexane-diol, polyetheramine (molecular weight 400-500 g/mol) and 1,3-dichloro-2-propanol.

The amine-based compound is not particularly limited, but may be at least one selected from the group consisting of 1,3-amino benzene, 2,6-diamino pyridine, aniline, 4-aminophenol, 1-naphthylamine, benzyl chloride, 2-amino pyridine and 1,3-diphenyl urea.

The temperature for dissolving the alkylation agent compound in the solvent is not particularly limited, but may be 50 to 180° C. In addition, the reaction ratio (a:b) of the alkylation agent compound (a) and the amine-based compound (b) is not particularly limited, but may be a weight ratio of 2:1 to 6:1.

The solvent used for dissolving the alkylation agent compound is not particularly limited as long as it is a commonly known solvent, but in consideration of solubility and synthesis efficiency, the solvent may be at least one selected from the group consisting of an aqueous solvent (water, purified water, deionized water, etc.), an alcohol-based solvent (ethanol, methanol, etc.) and an organic solvent (acetonitrile, dimethylformamide, etc.).

The present invention provides an electrolytic composition comprising the leveling agent. Specifically, the electrolytic composition according to the present invention includes a leveling agent and a metal ion source.

The description of the leveling agent included in the electrolytic composition according to the present invention is the same as described above, and thus will be omitted. The concentration (content) of this leveling agent is not particularly limited, but when considering the uniformity of the circuit pattern and plating efficiency, it may be 3 to 50 ml/l, and specifically 5 to 20 ml/l.

The metal ion source included in the electrolytic composition according to the present invention supplies metal ions in the composition, and may be a commonly known material. Specifically, the metal ion source may be a copper ion source. The concentration (content) of the metal ion source is not particularly limited, but considering the uniformity and density of the circuit pattern, it may be 100 to 300 g/L, and specifically 200 to 250 g/L.

The electrolytic composition according to the present invention may further include at least one selected from the group consisting of a strong acid, a halogen ion source, a brightener and a carrier (inhibitor) in order to increase its physical properties.

The strong acid included in the electrolytic composition according to the present invention serves as an electrolyte in addition to pH control, and may be a commonly known material. Specifically, the strong acid may be at least one selected from the group consisting of sulfuric acid, hydrochloric acid, methane sulfonic acid, ethane sulfonic acid, propane sulfonic acid, trifluoromethanesulfonic acid, sulfonic acid, hydrobromic acid, and fluoroboric acid. The concentration (content) of the strong acid is not particularly limited, but when considering the pH of the electrolytic composition, it may be 50 to 150 g/L, and specifically, 90 to 110 g/L.

The halogen ion source included in the electrolytic composition according to the present invention is for supplying halogen ions into the composition, and may be a commonly known material. Specifically, the halogen ion source may be a chlorine ion source. The concentration (content) of the halogen ion source is not particularly limited, but when considering the uniformity and density of the circuit pattern, it may be 30 to 60 mg/L, and specifically 40 to 50 mg/L.

The brightener included in the electrolytic composition according to the present invention is to promote plating by increasing the reduction rate of metal ions, and may be a commonly known material. Specifically, the brightener may be at least one selected from the group consisting of bis-(3-sulfopropyl)disulfide (sodium salt), 3-mercapto-1-propanesulfonic acid (sodium salt), 3-Amino-1-propanesulfonic acid, O-ethyl-S-(3-sulphopropyl) dithiocarbonate (sodium salt), 3-(2-Benzthiazole-1-thio)-1-propanesulfonic acid (sodium salt) and N,N-dimethyldithiocarbamic acid-(3-sulfopropyl)ester (sodium salt). The concentration (content) of the brightener is not particularly limited, but considering the plating rate and the like, it may be 0.5 to 5 ml/L, and specifically may be 1 to 3.5 ml/L.

The carrier included in the electrolytic composition according to the present invention is for increasing the surface flatness of the circuit pattern, and may be a commonly known material. The concentration (content) of the carrier is not particularly limited, but when considering the uniformity and plating efficiency of the circuit pattern, it may be 5 to 15 ml/L, and specifically 8 to 12 ml/L.

The present invention provides a method of filling via holes in a substrate with the electrolytic composition. Specifically, the method of filling via holes in the substrate according to the present invention comprises the steps of forming an electroless plating layer by performing electroless plating on the substrate on which the via hole is formed; and filling the via hole by performing electrolytic plating on the substrate on which the electroless plating layer is formed, which will be described in detail with reference to FIG. 1 as follows.

First, a via hole H is formed in the substrate 201. The substrate 201 may be a substrate 201 made of a conventionally known insulating resin. The via hole H may be formed by laser processing or CNC processing. Here, the via hole H may be formed in the form of a groove that does not penetrate the substrate 201 or a hole that penetrates the substrate 201 as shown in FIG. 1.

Next, the electroless plating is performed on the substrate 201, on which the via hole H is formed, to form an electroless plating layer 202 on the inside of the via hole H and the surface of the substrate 201. As a plating solution composition for performing the electroless plating, a commonly known composition may be used. As an example, a plating solution composition comprising copper ions, a copper ion complexing agent, a copper ion reducing agent, a pH adjusting agent and an additive may be used. In addition, the conditions of the electroless plating are not particularly limited, but may be made at a rate of 10 μm/Hr in a temperature range of 20 to 60° C. and pH 11 to 14.

Then, electrolytic plating is performed on the substrate 201, on which the electroless plating layer 202 is formed, to fill the via hole H. That is, the electrolytic plating layer 203 is formed. As the plating solution composition for performing the electrolytic plating, the electrolytic composition described above may be used.

Here, the current density applied during electrolytic plating with the electrolytic composition may be applied as a specific waveform. That is, referring to FIG. 2, a current density of a step-wise pulse (+ current applied)-repulse (− current applied) waveform having a cycle of '$t_1+t_2+t_3+t_4+t_5+t_6$' may be applied. Specifically, a waveform maintaining the positive current $I_1$ for a time $t_1$, then the positive current $I_2$ for a time $t_2$, then the negative current $I_3$ for a time $t_3$, then the negative current $I_4$ for a time $t_4$, then the negative current $I_3$ for a time $t_5$, and then the positive current $I_2$ for a period for a time $t_6$ is periodically applied for a predetermined period of time to perform the electrolytic plating.

Here, in order to minimize the formation of dimples and voids during via hole H filling plating, $I_1$ may be 2 to 5 ASD, $I_2$ may be 1 to 2 ASD, $I_3$ may be −1 to −2 ASD, and $I_4$ may be −3 to −10 ASD. Also, $t_1$, $t_2$, and $t_6$ may each be 10 to 80 ms (specifically, 30 to 50 ms), and $t_3$, $t_4$, and $t_5$ may each be 1 to 5 ms (specifically, 2 to 4 ms).

In this way, as the current density is applied as a step-by-step pulse reverse plating waveform representing the cycle of '$t_1+t_2+t_3+t_4+t_5+t_6$' during the electrolytic plating, the electrolytic plating can be done in a relatively short time (specifically 20 to 40 minutes) while minimizing the formation of dimples and voids.

Hereinafter, the present invention will be described in more detail by way of examples. However, the following examples are intended to illustrate the present invention, and it is clear to those skilled in the art that various changes and modifications can be made within the scope and spirit of the present invention, and the scope of the present invention is not limited thereto.

Example 1

Neopentyl glycol diglycidyl ether was added to ethanol and completely dissolved at a temperature of about 50° C. Next, 2,6-diamino pyridine was added and the reaction was carried out for 3 to 8 hours to synthesize a leveling agent compound. At this time, the reaction ratio of neopentyl glycol diglycidyl ether and 2,6-diaminopyridine was a weight ratio of 3:1.

Example 2

1,4-butane-diol was added to methanol and completely dissolved at a temperature of about 50° C. Next, aniline was added and the reaction was carried out for 3 to 8 hours to synthesize a leveling agent compound. At this time, the reaction ratio of 1,4-butane-diol and aniline was a weight ratio of 3:1.

Preparation Example 1

An electrolytic composition containing 230 g/L of copper sulfate pentahydrate, 100 g/L of sulfuric acid, 40 to 50 mg/L of hydrochloric acid, 1 to 3.5 ml/L of bis-(sodium sulfopropyl)-disulfide, 10 ml/L of carrier, and 10 ml/l of leveling agent of Example 1 was prepared.

Comparative Preparation Example 1

An electrolytic composition was prepared in the same manner as in Preparation Example 1, except that a known leveling agent (KBPA manufactured by Dicolloy company) was used instead of the leveling agent of Example 1.

Experimental Example 1

A via hole having a diameter of 90 μm and a depth of 100 μm was formed by laser processing on a substrate of an epoxy resin having a thickness of 200 μm. Next, a substrate of an epoxy resin having via holes was put into the electroless plating solution containing copper sulfate, EDTA, formalin, caustic soda and an additive for surface stabilization, and electroless plating was performed at 65° C. to form a copper seed layer. Then, electrolytic plating was performed using the electrolytic composition prepared in Preparation Example 1 and Comparative Preparation Example 1, respectively, to fill the via hole. When plating with the electrolytic composition, the plating conditions were set as follows.

Temperature of the electrolytic composition: 21 to 24° C.
Stirring: 0.5 to 1.5 LPM/con.
Electrode: Insoluble electrode
Current density: applying the step-wise pulse reverse plating waveform under the conditions of Table 1 below

TABLE 1

| Current density | | Application time | | | | Average current | | |
|---|---|---|---|---|---|---|---|---|
| $I_{for}$ (ASD) | $I_{rev}$ (ASD) | $T_{for}$ (sec) | $T_{rev}$ (sec) | $T_{off}$ (sec) | Frequency (Hz) | $I_{for\_AVG}$ (ASD) | $I_{rev\_AVG}$ (ASD) | Duty cycle |
| 3.6 | 12 | 0.04 | 0.004 | 0.002 | 22 | 3.27 | 2.09 | 0.91 |

After completing the via hole filling plating, the cross-section of the substrate was confirmed with an optical microscope, and the result is shown in FIG. 3.

Referring to FIG. 3, it was confirmed that in the case of Preparation Example 1 in which electroplating was performed with the electrolytic composition according to the present invention, via hole filling is well done without the occurrence of voids and dimples, whereas in the case of Comparative Preparation Example 1, voids and dimples were generated, and thus via hole filling was not performed well.

Experimental Example 2

When plating with the electrolytic composition in Experimental Example 1, the conditions for applying the current density were adjusted as shown in Table 2 below, and via hole filling plating was performed. After filling plating was completed, it was evaluated whether dimples and voids were formed on the cross section of the substrate, and the results are shown in Table 3 below. In this case, a direct current (DC) waveform, not a step-wise pulse reverse plating waveform, was applied as a comparison condition.

TABLE 2

| Item | Current density $I_{for}$ (ASD) | Current density $I_{rev}$ (ASD) | Application time $T_{for}$ (sec) | Application time $T_{rev}$ (sec) | Application time $T_{off}$ (sec) | Frequency (Hz) | Average current $I_{for,AVG}$ (ASD) | Average current $I_{rev,AVG}$ (ASD) | Duty cycle |
|---|---|---|---|---|---|---|---|---|---|
| Condition 1 | 3.6 | 12 | 0.04 | 0.004 | 0.002 | 22 | 3.27 | 2.09 | 0.91 |
| Condition 2 | 3 | 6 | 0.04 | 0.002 | 0.002 | 23 | 2.86 | 2.45 | 0.95 |
| Condition 3 | 3.6 | 8 | 0.04 | 0.004 | 0.002 | 22 | 3.27 | 2.43 | 0.91 |
| Condition 4 | 3 | 5 | 0.04 | 0.002 | 0.002 | 23 | 2.86 | 2.50 | 0.95 |
| Comparison condition 1 | 1.2 | 0 | 0 | 0 | — | 1 | 1.20 | 0.00 | — |
| Comparison condition 2 | 2.4 | 0 | 0 | 0 | — | 1 | 2.40 | 0.00 | — |
| Comparison condition 3 | 3.6 | 0 | 0 | 0 | — | 1 | 3.60 | 0.00 | — |

TABLE 3

| Item | Via hole filling plating time (min) | Dimple(μm) | Void generation rate (%) |
|---|---|---|---|
| Condition 1 | 35 | 0 | 0 |
| Condition 2 | 29 | 5.3 | 1 |
| Condition 3 | 30 | 0 | 1 |
| Condition 4 | 29 | 7 | 0 |
| Comparison condition 1 | 60 | 0 | 3 |
| Comparison condition 2 | 30 | 34 | 0 |
| Comparison condition 3 | 20 | 99 | 0 |

Referring to Table 3 above, it can be confirmed that when filling via holes with the electrolytic composition according to the present invention, as a step-wise pulse reverse plating waveform is applied, plating is performed well even if the plating time for via hole filling is relatively short, thereby minimizing the occurrence of dimples and voids. Whereas, it can be confirmed when applying a DC waveform, the plating time for 60 minutes or more is required to prevent dimples and voids from occurring, and when plating is performed within 30 minutes, dimples are severely generated.

DESCRIPTION OF SYMBOLS

201: Substrate
202: Electroless plating layer
203: Copper electrolytic plating layer

What is claimed is:

1. A leveling agent which is a compound represented by Formula 1 or Formula 2 below:

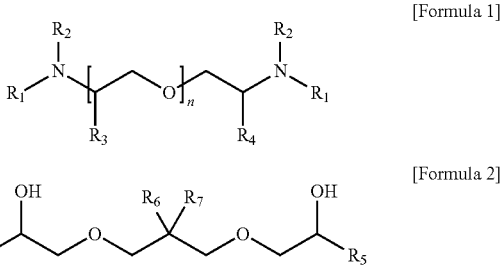

[Formula 1]

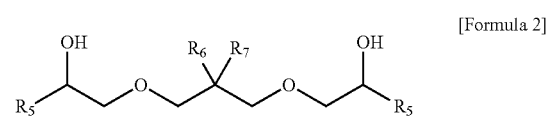

[Formula 2]

wherein, $R_1$ to $R_4$ are each independently selected from the group consisting of a $C_1$ to $C_{10}$ alkyl group, a $C_6$ to $C_{20}$ aryl group, and a $C_2$ to $C_{20}$ heteroaryl group, and, when two or more of $R_1$-$R_4$ are present, the $R_1$ and $R_2$ groups may be the same or different from each other, $R_5$ is selected from the group consisting of a $C_1$ to $C_{10}$ alkyl group, a $C_6$ to $C_{20}$ aryl group, a $C_2$ to $C_{20}$ heteroaryl group, and —$NR_{10}R_{11}$, and, when two or more $R_5$ groups are present, the $R_5$ groups may be the same or different from each other, $R_6$ and $R_7$ are each independently selected from the group consisting of a $C_1$ to $C_{10}$ alkyl group, a $C_6$ to $C_{20}$ aryl group and a $C_2$ to $C_{20}$ heteroaryl group, n is an integer from 1 to 10, $R_{10}$ and $R_{11}$ are each independently selected from the group consisting of hydrogen, a $C_1$ to $C_{10}$ alkyl group, and a $C_6$ to $C_{20}$ aryl group, and each of the alkyl group, the aryl group and the heteroaryl group of $R_1$ to $R_7$ is each independently substituted or unsubstituted with one or more substituents selected from the group consisting of a halogen group, a $C_1$ to $C_{10}$ alkyl group, and a $C_6$ to $C_{20}$ aryl group.

2. The leveling agent according to claim 1, wherein $R_1$ and $R_2$ are each independently a $C_1$ to $C_5$ alkyl group substituted with a $C_6$ to $C_{10}$ aryl group.

3. The leveling agent according to claim 1, wherein $R_3$ and $R_4$ are each independently a $C_1$ to $C_5$ alkyl group.

4. The leveling agent according to claim 1, wherein $R_5$ is selected from the group consisting of a $C_2$ to $C_{10}$ heteroaryl group and —$NR_{10}R_{11}$, wherein $R_{10}$ and $R_{11}$ are each independently selected from the group consisting of hydrogen and a $C_6$ to $C_{10}$ aryl group.

5. The leveling agent according to claim 1, wherein $R_6$ and $R_7$ are each independently a $C_1$ to $C_5$ alkyl group.

6. An electrolytic composition comprising a metal ion source; and the leveling agent according to claim 1.

7. A method of filling a via hole in a substrate comprising the steps of, forming the via hole in the substrate;

forming an electroless plating layer by performing electroless plating on the substrate on which the via hole is formed; and filling the via hole by performing electrolytic plating on the substrate on which the electroless plating layer is formed, wherein the electrolytic plating is performed with the electrolytic composition according to claim 6.

8. The method of filling the via hole in the substrate according to claim 7, wherein a stepwise pulse reverse plating waveform current density is applied to the electrolytic plating.

* * * * *